(12) United States Patent
Van Dalen et al.

(10) Patent No.: US 7,859,076 B2
(45) Date of Patent: Dec. 28, 2010

(54) EDGE TERMINATION FOR SEMICONDUCTOR DEVICE

(75) Inventors: Rob Van Dalen, Bergeijk (NL); Maarten J. Swanenberg, Berg en Dal (NL)

(73) Assignee: NXP B.V., Eindhoven (NL)

( * ) Notice: Subject to any disclaimer, the term of this patent is extended or adjusted under 35 U.S.C. 154(b) by 32 days.

(21) Appl. No.: 11/914,648

(22) PCT Filed: May 22, 2006

(86) PCT No.: PCT/IB2006/051633

§ 371 (c)(1),
(2), (4) Date: Sep. 23, 2009

(87) PCT Pub. No.: WO2006/126164

PCT Pub. Date: Nov. 30, 2006

(65) Prior Publication Data

US 2010/0001362 A1   Jan. 7, 2010

(30) Foreign Application Priority Data

May 24, 2005   (EP)   ................... 05104415

(51) Int. Cl.
  *H01L 31/102* (2006.01)
  *H01L 29/02* (2006.01)
(52) U.S. Cl. ............... 257/452; 257/171; 257/E29.006; 257/E23.033
(58) Field of Classification Search ........... 257/490, 257/487, 488, 492, 493, E20.006, E29.006, 257/452, 171, E23.033, E21.009, E21.304; 438/337, 400, 427
See application file for complete search history.

(56) References Cited

U.S. PATENT DOCUMENTS

| | | | |
|---|---|---|---|
| 6,376,890 B1 | 4/2002 | Tihanyi | |
| 6,724,021 B2 | 3/2004 | Van Dalen et al. | |
| 2002/0037636 A1* | 3/2002 | Schulze et al. | 438/545 |
| 2002/0134998 A1* | 9/2002 | Van Dalen et al. | 257/213 |
| 2003/0222327 A1 | 12/2003 | Yamaguchi et al. | |
| 2005/0156232 A1* | 7/2005 | Hueting et al. | 257/330 |
| 2005/0215011 A1* | 9/2005 | Darwish et al. | 438/270 |

FOREIGN PATENT DOCUMENTS

WO   WO2004/001854   * 12/2003

OTHER PUBLICATIONS

Dalla Betta, Gian-Franco; et al "A Novel Silicon Microstrip Termination Structure with all P-Type Multiguard and Scribe-line Implants" IEEE Transactions on Nuclear Science, vol. 49, No. 4, Aug. 2002, pp. 1712-1716.
Jayant, Baliga B. "Power Semiconductor Devices" John Wiley & Sons, Inc. 1987, pp. 99-100 (Figure 3.7).

* cited by examiner

*Primary Examiner*—Thomas L Dickey
*Assistant Examiner*—Nikolay Yushin

(57) ABSTRACT

A semiconductor device has active region (30) and edge termination region (32) which includes a plurality of floating field regions (46). Field plates (54) extend in the edge termination region (32) inwards from contact holes (56) towards the active region (30) over a plurality of floating field regions (46). Pillars (40) may be provided.

11 Claims, 5 Drawing Sheets

EDGE TERMINATION FOR SEMICONDUCTOR DEVICE

The invention relates to an edge termination structure for a semiconductor device.

Edge termination is a particular requirement in high voltage devices, to avoid voltage breakdown at the edges of devices. Breakdown occurs when the peak field reaches the so-called critical field, about $3 \times 10^5$ Vcm$^{-1}$.

In an ideal (imaginary) infinitely wide vertical structure, the breakdown will occur at a certain breakdown voltage which will be referred to as the 1D breakdown voltage, since it ignores 2D and/or 3D effects at the edge. In a real device, the breakdown voltage will be lower than the 1D breakdown voltage.

As an example, consider the high voltage pn diode of FIG. 1, with a p+ type region 2 in an n− type substrate 4. When a voltage is applied, field lines 6 crowd in corner region 8. Since the field is higher in region 8 breakdown will occur first in this region as the voltage is raised.

Surface charge can change the field distribution, enhancing the field crowding, leading to breakdown at lower and less reproducible voltages.

FIG. 2 shows one approach to reducing this problem, using floating p− type regions 10 around the junction that will, in use, take on an intermediate potential. The depletion layer and field lines no longer follow the curvature around the junction between p type region 2 and n type substrate 4, reducing field crowding and voltage breakdown in corner region 8.

Another approach uses a field plate 12 and an insulating layer 14 as illustrated in FIG. 3, in which the field plate 12 extends over the region of the n-type substrate adjacent to p+ type region 2, insulated from it by the insulating layer 14.

The textbook "Power Semiconductor Devices" by Baliga, published by PWS publishing, Boston US, 1995, describes (in FIG. 3.27 of the textbook) a combination of field rings and field plates, the field plates extending outwardly from the field rings to prevent charges on the top surface of the device from altering the surface potential.

A more complex scheme is described in U.S. Pat. No. 6,724,021 assigned to Philips which uses a resistive layer on the surface around a power metal-oxide semiconductor field effect transistor (MOSFET). A number of resistive paths at different distances from the edge join the resistive layer to the underlying substrate, creating a potential divider that smoothes the electric field and so reduces device susceptibility to deviations in the field profile.

A different edge termination is provided in U.S. Pat. No. 6,376,890 assigned to Siemens, the termination including a plurality of floating regions at the surface of the semiconductor, an insulating layer over the surface and field plates insulated within the insulating layer connected to the floating regions.

Edge termination is particularly important in reduced surface field (RESURF) devices. In such devices, a drift region is depleted when the device is in an off-state to enhance the maximum voltage that the device withstands, compared to a device with a conventional drift region, but otherwise similar current carrying capacity. This can be achieved, for example, by using a drift region made up of alternating p− and n− type layers so that the depletion region of the junctions extends through the drift region.

Since the device itself is more able to resist high voltages, the edge termination must also withstand high voltages. Indeed, RESURF devices can typically withstand voltages several times higher than the 1D breakdown voltage of a corresponding non-RESURF device and this presents great problems for edge termination.

In order to achieve this, the edge termination structure typically needs to be at least twice as wide as the depth of the structure to allow the voltage to be dropped over a sufficiently large area. A floating regions approach similar to that shown in FIG. 2 is therefore appropriate, although a much larger number of floating regions will be required than when compared to conventional devices.

However, there is a problem with all these approaches in that the variable effects of surface charge can be significant in these devices, since the edge termination experiences a combination of unknown ambient conditions when close to both low and high voltage regions. This introduces a variable potential distribution which can affect the edge termination.

In order to compensate for this variability, the edge termination structure then needs to be designed conservatively to be larger than would otherwise be necessary to allow for possible unfavourable conditions.

According to the invention there is provided a semiconductor device with an edge termination structure, comprising
a semiconductor body with opposed first and second major surfaces;
an active region of the semiconductor body defining at least one semiconductor component;
an edge termination region outside the active region, wherein the edge termination region includes:
a plurality of floating field regions in the semiconductor body;
an insulating layer over the first major surface over the floating field regions; and
at least one field plate connected at a connection point through the insulating layer to the first major surface in the edge termination region and extending inwards from the connection point towards the active region over a plurality of floating field regions.

By extending the field plate inwards from the connection point over a plurality of floating field regions, the field plate in use takes on a voltage that is similar to the voltage at the connection point, which is significantly different to the voltage of the inner field region or regions under the field plate. This voltage is able to significantly reduce the effect of oxide and surface charges on the edge termination structure. Also, the use of a field plate extending over several floating field regions allows larger field plates to be used which aids manufacture.

In an embodiment the floating field regions are semiconductor regions of first conductivity type at the first major surface.

An underlying region of the semiconductor body of second conductivity type opposite to the first conductivity type may underlie the floating field regions, the underlying region being spaced from the floating field regions by a spacer region of lower doping than the underlying region and the floating field regions.

The spacer region of lower doping may extend from the edge termination region into the active region and may act as the drift region in the active region. In this way the same structure is used in the active and edge termination region, easing manufacture.

The spacer region may include regions of first conductivity type alternating with the regions of second conductivity type, both regions being of lower doping than the floating field regions and the underlying region.

The spacer region may include laterally extending regions of first conductivity type alternating vertically with laterally extending regions of second conductivity type.

Alternatively, the spacer region may include regions of first conductivity type vertically extending from the floating field regions to the underlying region alternating laterally with regions of second conductivity type.

In another arrangement the spacer region includes a plurality of regions of first conductivity type alternating with regions of second conductivity type both laterally and vertically.

The device may include a plurality of field plates spaced at increasing distances from the active region, the or each gap between adjacent field plates being arranged over a floating field region. This can increase stability.

In a particularly preferred arrangement, the or each gap between adjacent field plates may be arranged over a joining region. The joining region is a floating field region of greater width than the other floating field regions.

The spacing between adjacent floating field regions may be greater in the edge region at greater distances from the active region than closer to the active region.

For a better understanding of the invention, embodiments will now be described, purely by way of example, with reference to the accompanying drawings, in which.

The drawings are purely schematic and not to scale. Like components are shown with the same reference numeral in different figures.

Figure 1:
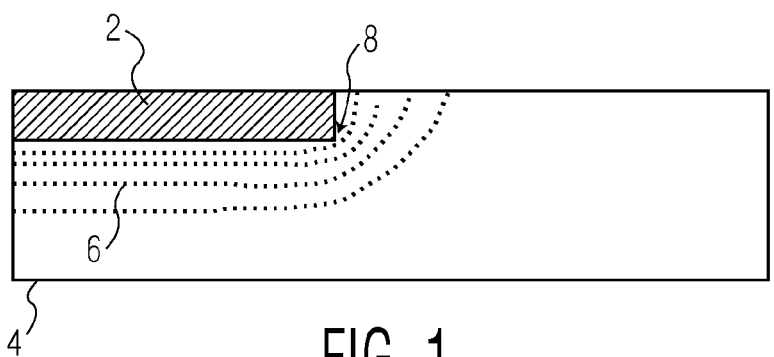
FIG. 1 shows a schematic of a prior art device illustrating field crowding.
Figure 2:
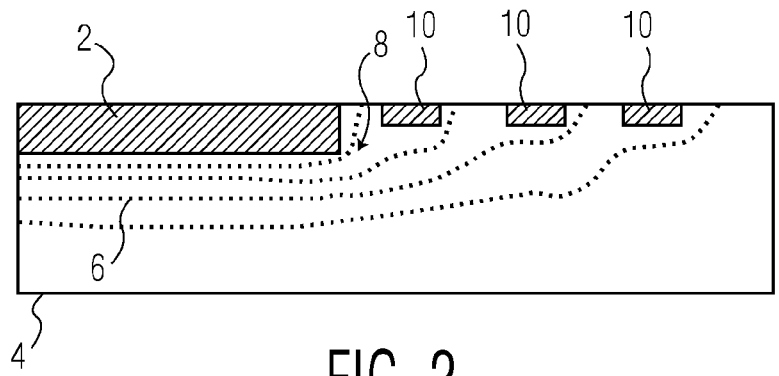
FIG. 2 shows an approach according to a comparative example.
Figure 3:
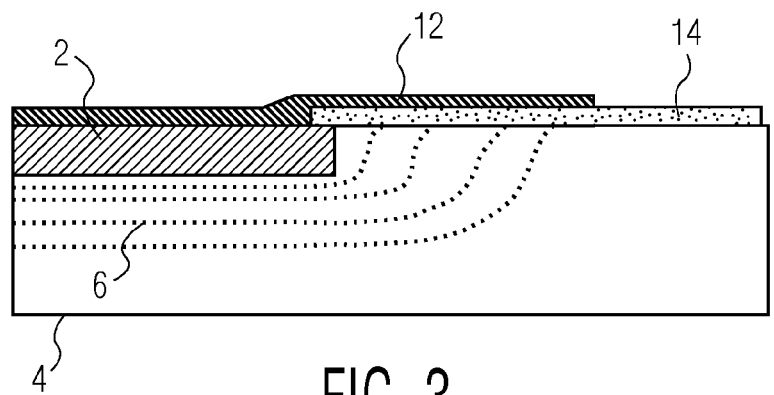
FIG. 3 shows an approach according to another comparative example.
Figure 4:
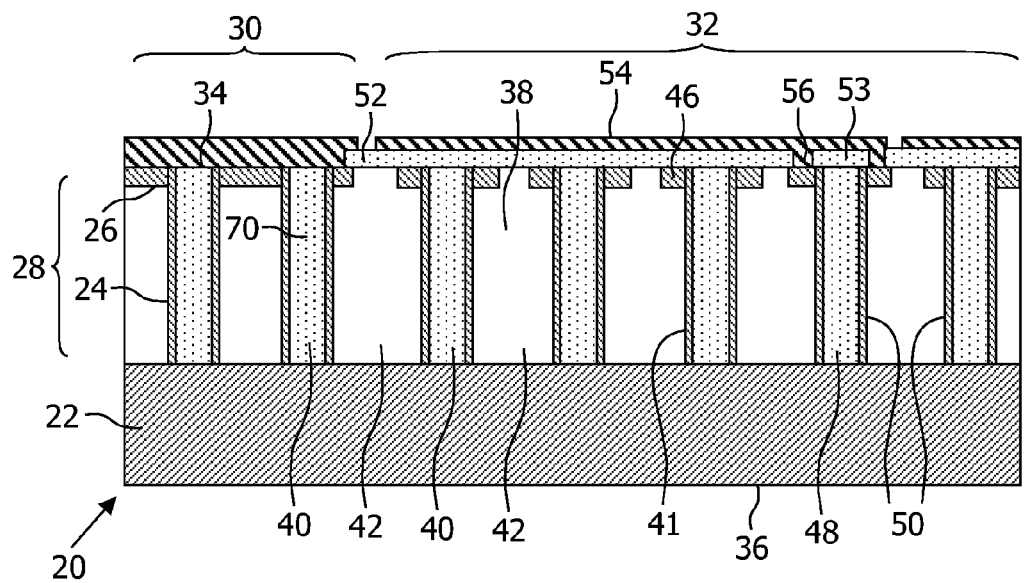
FIG. 4 is a side section through a first embodiment of a semiconductor device according to the invention.
Figure 5:
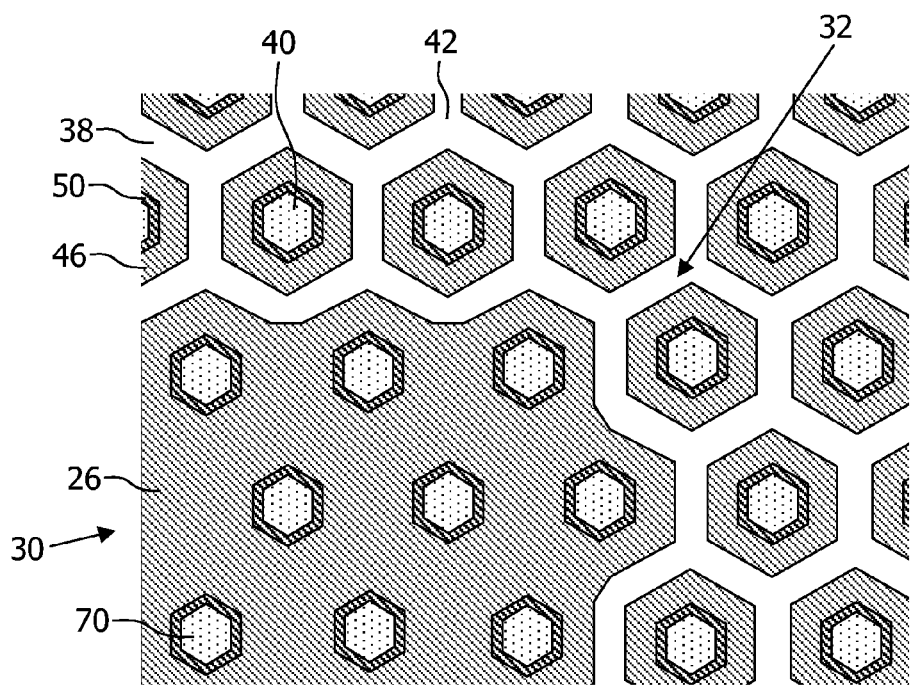
FIG. 5 is a top view of the semiconductor body of the arrangement of FIG. 4.

Referring to FIGS. 4 and 5, a semiconductor device 20 according to a first embodiment of the invention is formed on a n+ substrate 22 doped to be heavily n type. An epitaxial layer 28 is formed on the substrate, including drift region 24 and heavily doped p-type region 26. The front of the semiconductor device defines a first (top) major surface 34 and the rear defines a second (bottom) major surface 36 opposed to the first major surface. The substrate 22 and epilayer 28 define a semiconductor body 22,28 having underlying region 22 (the substrate) and the epilayer 28 acts as a spacer layer.

It will be appreciated that in alternative embodiments a single semiconductor body may be used, which may be doped to provide a spacer without requiring the use of an epilayer 28.

In an active region 30, only the edge of which is shown in FIG. 4, a lightly doped n-type drift region 24 is formed above the n type substrate, above which is a heavily doped p-type region 26 at the first major surface 34. In this embodiment, the drift region is simply an n-type region.

RESURF structures 70 are provided in the drift region 24 of the active region 30 of the device. The RESURF structures 70 act to deplete the drift region 24 when the device is off, increasing the voltage that can be supported by the active region and hence increasing the need for an effective edge termination structure. Their structure will be discussed below.

The active region 30 may include any semiconductor device, for example a diode, thyristor or transistor, such as an insulated gate transistor which may be a horizontal or vertical MOSFET, a bipolar device, or a combination of such devices.

Around the edge of the active region 30 is provided an edge termination region 32, only part of which is shown in FIGS. 4 and 5.

The edge termination region 32 includes underlying substrate region 22 and above that is spacer region 38 which is structured as follows.

A plurality of pillars 40 are formed in the spacer region 38 around the edge of the active region 30, the pillars 40 defining intermediate regions 42 of n-type silicon between them. It will be noted that in the embodiment the RESURF structures 70 are exactly the same as the pillars 40 used in the edge termination region 32—this allows them to be manufactured at the same time and using the same process.

As illustrated in FIG. 5, the pillars 40 are spaced around the active region 30. Note that, for clarity, FIG. 5 only shows the semiconductor body and not insulating layer 52 or field plates 54 above the insulating layer which are described below with reference to FIG. 4.

In the embodiment of FIG. 4, the pillars 40 and RESURF structures 70 are formed in trenches extending from the first major surface 34 as far as the substrate 22 through the floating regions 46 and the intermediate regions 42. The pillars can extend a little way into substrate 22 if required. The pillars 40 include a central insulating region 48 and thin p− type layers 50 on the sidewalls of the trenches.

Floating regions 46 are provided at the top of the pillars at the first major surface 34. The floating regions 46 are p+ regions that are heavily doped p− type.

Above the first major surface 34 is an insulating layer 52 and above this is a plurality of field plates 54 connected to the underlying floating regions 46 through respective contact holes 56 in the insulating layer 52 acting as connection points.

Note in particular that the field plates 54 extend inwards towards the active region 30 from the contact holes 56 over a plurality of the floating regions 46.

In this embodiment central cover regions 53 cover the centre of the floating regions 46 ensuring that the contact hole 56 is not present at the centre of the of the floating region 46. Thus, the contact hole 56 is in the form of a ring. Note that such cover regions 53 are not essential.

The structure according to FIG. 4 can be manufactured as follows, where a description of the processing to form the active device will be omitted.

Firstly, n-doped epilayer 28 is formed on n+ doped substrate 22. The epilayer 28 can be doped lightly n− type either with a blanket doping or masked to provide doping only in certain regions, for example in the edge termination region and not the active region.

Then, the heavily doped p-type region 26 and the floating regions 46 are formed by implantation in the first major surface 34 at the top of the epilayer 28. Next, trenches 41 are formed, p+ type layers 50 formed on the sidewalls for example by selective epitaxial growth or by a diffusion process where dopants are diffused in from the gas phase. The trenches are then filled with insulator 48.

In the devices used, the n-type doping is in the range up to $10^{16}$ cm$^{-3}$ and the p-type doping around $10^{16}$ to $10^{18}$ cm$^{-2}$ The p+ type layers are still more heavily doped.

An insulating layer 52 is formed, conveniently of silicon dioxide and patterned to expose the active region 30 as well as form the contact holes 56. Then, the field plates 54 can be formed and patterned.

In use, the arrangement described provides a useful edge termination.

Figure 6:
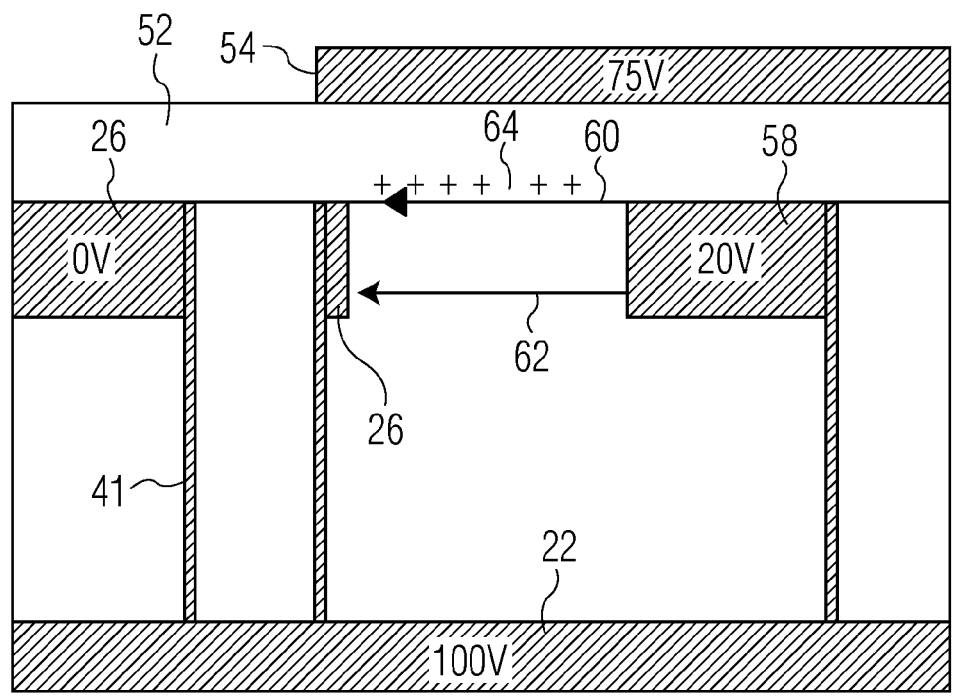
FIG. 6 is an illustration of the arrangement of FIG. 4 in use.

Consider the case (illustrated in FIG. 6) that the p+ type layer 26 of the active region 30 is held at 0V and the n+ substrate 22 at 100V. The first floating region 58 outside the active region may then be at a voltage of roughly 20V. However, the field plate is connected to a floating region significantly further away from the active region 30 and hence at a potential much closer to that of substrate 22. In the example, the field plate is at a potential of 75V.

Thus, by providing field plates extending inwards over several floating regions 46 from the contact hole 56 the potential of the field plate, in use, is significantly positive, much more so than if the field plate was connected to the adjacent floating region (compare U.S. Pat. No. 6,376,890) or if the field plate extends outwards from the floating region (compare the textbook by Baliga). Indeed, in the conventional case with the field plate extending outwards, the field plate will be negative with respect to the floating regions.

In general, without a potential on the field plate, as the voltage is raised punch through between the active region 30 and the adjacent floating region 58 will occur at the surface along surface path 60. The punch through between these two p-type regions occurs by means of a hole flow when the spacer layers becomes fully depleted. Since the punch through occurs at the surface, adjacent to the oxide of insulating layer 52, the oxide interface charge 64 or any other surface charge has a significant effect on the punch-through, and hence on the exact voltage at which punch through occurs.

A negative voltage on the field plate merely attracts the holes and so punch through still occurs at the surface.

Without wishing to be bound by theory, the inventor considers that the large positive potential on the field plate will increase the voltage at which punch through occurs, and also cause the punch through to occur below the surface along path 62 rather than at the surface.

By separating the punch-through path 62 from the surface, the effects of surface charge, including the oxide-semiconductor interface charge, become significantly reduced and so the punch through voltage becomes much less dependent on manufacturing and operational characteristics that are not well controlled.

In a normal semiconductor device the semiconductor device has to be designed very conservatively to allow for the worst case scenario. By using the approach of the invention the dependence of the punch through voltage on surface charge becomes less and this allows a more aggressive, smaller design to be used than would otherwise be possible.

Punch through occurring below the surface can also increase the thermal stability of the design.

A further benefit of the invention is that the exact bias of the field plates is less important than in prior art arrangements. This means that the layout of the field plates is not critical, making them easier to manufacture.

A smaller number of field plates and contacts is required than in prior arrangements, and this allows for a smaller edge termination region.

The embodiment allows a reduction in overhead, i.e. the additional area taken up by the edge termination structure.

The approach of the embodiment is particularly useful when lithographic constraints do not allow the formation of a gap and a contact at the same size.

Figure 7:
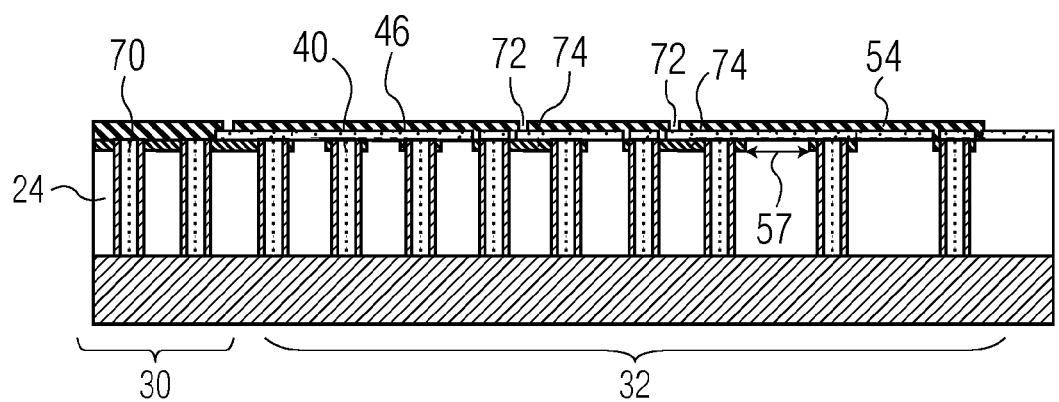
FIG. 7 is a side section through a second embodiment of a semiconductor device according to the invention.

FIG. 7 illustrates a further embodiment of the invention with some further improvements.

As seen in FIG. 7, a plurality of field plate structures 54 are provided outwards from the active region 30, each extending over a plurality of floating regions 46. Gaps 72 separate the field plates 54.

However, as seen in FIG. 7, in this device there is a difference from the device of FIG. 4, in that underlying the gaps 72 between adjacent field plates the floating region takes a different structure, having a joining region 74 between adjacent pillars 40. This joining region 74 is a larger floating region 46 spanning the gap between two adjacent pillars 40. The joining region 74 reduces the voltage between the adjacent pillars underlying the gaps 72 between adjacent field plates. Since these gaps 72 are less protected by the field plates, premature punch-through or even destructive breakdown could otherwise occur at these locations, the likelihood of which will reduce in this embodiment. This still further increases stability over the arrangement of FIG. 4.

A further improvement is also visible in FIG. 7. The spacing 57 between adjacent floating regions 46 is greater between the outer floating regions 46 than between the inner floating regions 46, where the outer floating regions are in the edge region 32 further from the active region 30 than the inner floating regions.

Although FIG. 7 only shows two different spacings, preferred embodiments have a gradually increasing spacing between floating regions 46 moving away from the active region 30 outwards through the edge region 32.

Figure 8:
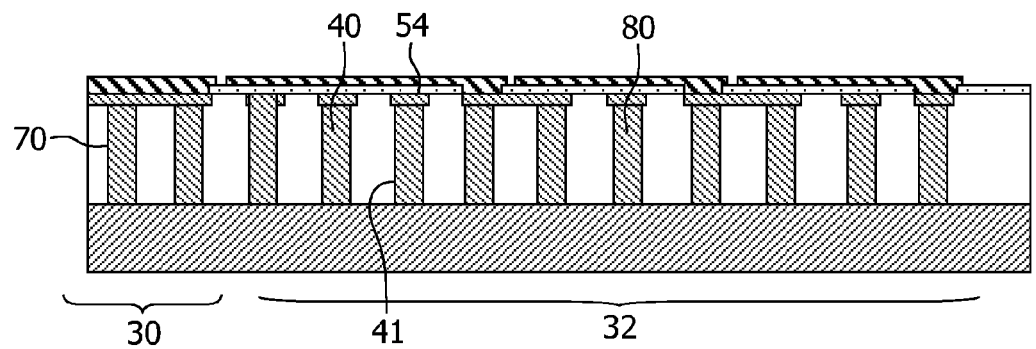
FIG. 8 is a side section through a third embodiment of a semiconductor device according to the invention.

A further variation is illustrated in FIG. 8 which shows a different RESURF structure 70 and pillar 40 to that of FIGS. 4 and 7. In the arrangement of FIG. 8, each pillar 40 and RESURF structure 70 are in the form of a trench 41 with a p-type region 80 filling trench 40,70.

Again, the same structure is used in both the active region 30 to form the RESURF structure 70 and the edge termination region 32 to form pillars 40.

Figure 9:
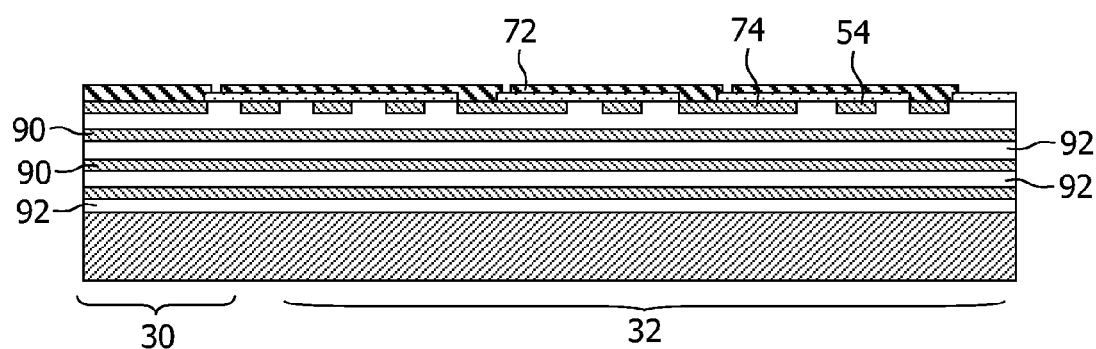
FIG. 9 is a side section through a fourth embodiment of a semiconductor device according to the invention.

FIG. 9 shows a further alternative embodiment in which the RESURF structure is formed as multiple horizontal p-type layers 90 and n-type layers 92. The pillars 40 are absent. The floating regions 46 are arranged around the active region 30 as before.

Note that in this structure the joining region 74 is still used, although it no longer joins adjacent pillars but merely has the same structure as floating regions 46 but is of larger width.

This type of layered RESURF arrangement can be made using multiple epitaxial and implantation steps.

Figure 10:
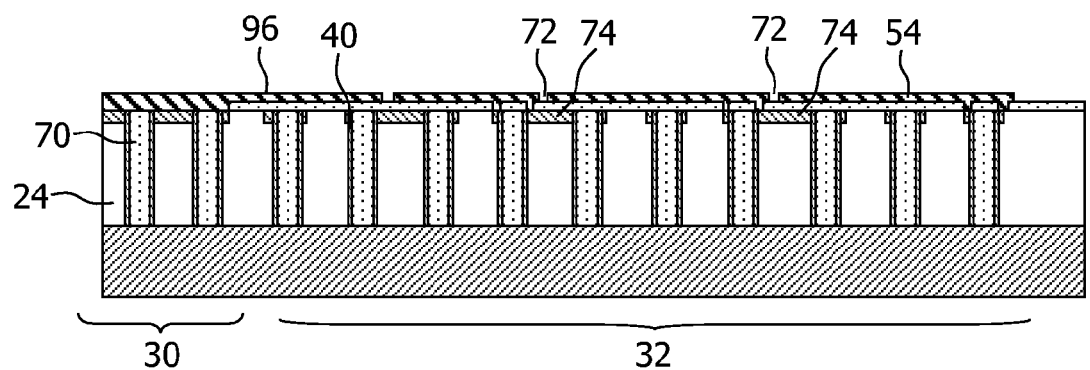
FIG. 10 is a side section through a fifth embodiment of a semiconductor device according to the invention.

FIG. 10 shows a further combination. The outer field plates 54, that is to say the field plates away from the active region 30, point inwards, i.e. extend towards the active region 30 over a plurality of floating regions 46 from contact holes 56.

However, the innermost field plate 96 is connected at its inner end, i.e. closest to the active region 30, not the outer edge furthest from the active region. Thus, this field plate extends outwards away from the active region 30.

Although FIG. 10 only shows the innermost field plate 96 connected in this way, this is not essential and it is also possible for a pluralilty of inner field plates to be connected this way having contact holes at the inner end of the field plate (or even elsewhere) and extending away from the active region 30, with only the outer field plates 54 being connected with the contact holes at their outer edge.

Figure 11:
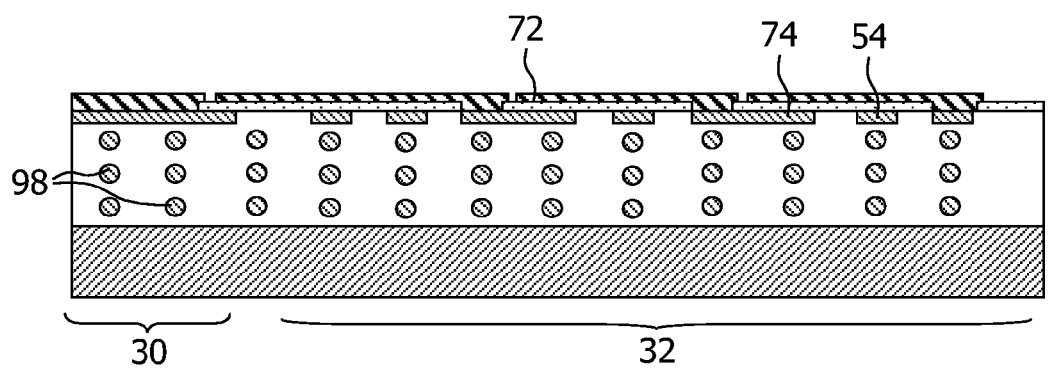
FIG. 11 is a side section through a sixth embodiment of a semiconductor device according to the invention.

A further modification is shown in FIG. 11 which replaces the pillars of FIGS. 4, 7, 8 and 10 with a plurality of p-doped regions 98 spaced vertically and laterally, to act as RESURF regions in the active region 30.

The skilled person will realise that the invention is not limited to the embodiments discussed above.

In particular, the p-type and n-type doped layers may be reversed.

The floating regions 46 need not be arranged as separate pillars or areas in the edge termination structure, but may also be arranged as rings around the active region, or any other form as required.

Other forms of active device, including structures with trench gates, complicated RESURF arrangements, or indeed any combination of such structures may be used in the active region. The active region may include field effect and/or bipolar type devices.

A variety of insulating materials may be used for insulating layer 52 and insulating region 48, including silicon dioxide, silicon nitride, spin-on glass or any other insulating material. Likewise, the field plates can be made of metal, metal alloy combinations such as silicides, salicides, polysilicon, or other material that provides an effective conductor.

A variety of manufacturing methods may be used, including forming the alternating parts of the spacer region 38 by etching trenches and filling the trenches, by multiple layer epitaxial growth and implantation, or any other method.

The semiconductor used is not restricted, and as well as silicon, any semiconductor material may be used.

Further, although in most embodiments the RESURF structures (where present) are arranged under the floating field regions there is no absolute requirement that this is the case and it is perfectly possible for the RESURF structures to be patterned independently.

Although the embodiments have been described with respect to RESURF structures it is possible to apply the invention to structures which are not RESURF structures without pillars, sheets or regions.

The invention claimed is:

1. A semiconductor device with an edge termination structure, comprising:
   a semiconductor body with opposed first and second major surfaces;
   an active region of the semiconductor body defining at least one semiconductor component;
   an edge termination region outside the active region, wherein the edge termination region includes:
   a plurality of laterally spaced floating field regions;
   an insulating layer over the first major surface; and
   a plurality of field plates each electrically coupled at respective contact holes through the insulating layer to the first major surface in the edge termination region and extending inwards from the respective contact holes towards the active region over the plurality of floating field region, the plurality of field plates spaced from the active region defining at least one gap between adjacent field plates; such that the at least one gap between adjacent field plates is arranged over a joining region being a floating field region of greater width than the other floating field regions.

2. A semiconductor device according to claim 1 wherein: the floating field regions are semiconductor regions of first conductivity type at the first major surface; an underlying region of the semiconductor body of second conductivity type opposite to the first conductivity type underlies the floating field regions, the underlying region being spaced from the floating field regions by a spacer region of lower doping than the underlying region and the floating field regions.

3. A semiconductor device according to claim 2 wherein the spacer region of lower doping extends from the edge termination region into the active region and acts as the drift region in the active region.

4. A semiconductor device according to claim 2 wherein the spacer region includes regions of first conductivity type alternating with the regions of second conductivity type, the alternating regions of first and second conductivity type both being of lower doping than the floating field regions and the underlying region.

5. A semiconductor device according to claim 4 wherein the spacer region includes pillars including regions of first conductivity type vertically extending through the spacer region to the underlying region defining regions of second conductivity type between the pillars.

6. A semiconductor device according to claim 5 wherein in the edge termination region the pillars are arranged under the floating field regions.

7. A semiconductor device according to claim 4 wherein the spacer region includes laterally extending regions of first conductivity type alternating vertically with laterally extending regions of second conductivity type.

8. A semiconductor device according to claim 4 wherein the spacer region includes a plurality of regions of first conductivity type alternating with regions of second conductivity type both laterally and vertically.

9. A semiconductor device according to claim 2 wherein the floating field regions are arranged as a two dimensional array of regions at the first major surface in the edge termination region.

10. A semiconductor device according to claim 9 wherein the floating field regions are arranged as a hexagonal array of regions at the first major surface in the edge termination region.

11. A semiconductor device according to claim 1 wherein the spacing between adjacent floating field regions is greater in the edge region at greater distances from the active region than closer to the active region.

* * * * *